(12) United States Patent
Bulaga et al.

(10) Patent No.: US 6,618,682 B2
(45) Date of Patent: Sep. 9, 2003

(54) METHOD FOR TEST OPTIMIZATION USING HISTORICAL AND ACTUAL FABRICATION TEST DATA

(75) Inventors: Raymond J. Bulaga, Richmond, VT (US); Anne E. Gattiker, Austin, TX (US); John L. Harris, South Burlington, VT (US); Phillip J. Nigh, Williston, VT (US); Leo A. Noel, Essex Junction, VT (US); William J. Thibault, White River Junction, VT (US); Jody J. Van Horn, Underhill, VT (US); Donald L. Wheater, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/838,996

(22) Filed: Apr. 20, 2001

(65) Prior Publication Data

US 2002/0155628 A1 Oct. 24, 2002

(51) Int. Cl.⁷ .......................... G01N 37/00; G06F 19/00
(52) U.S. Cl. ............................................ 702/84; 702/81
(58) Field of Search ................ 702/84, 81; 324/158, 324/500, 537, 765; 438/14, 18

(56) References Cited

U.S. PATENT DOCUMENTS

| | | | |
|---|---|---|---|
| 5,503,161 A | * 4/1996 | Van Den Heuvel | ......... 128/925 |
| 5,631,856 A | 5/1997 | Keller et al. | .................... 716/4 |
| 5,657,486 A | 8/1997 | Czamara et al. | ............ 712/245 |
| 5,764,545 A | 6/1998 | Cannata et al. | ............. 702/123 |
| 5,799,266 A | 8/1998 | Hayes | ........................ 702/123 |
| 5,983,381 A | 11/1999 | Chakradhar et al. | ........ 714/738 |
| 5,996,101 A | 11/1999 | Masumoto | ................... 714/738 |
| 6,014,764 A | 1/2000 | Graeve et al. | .............. 714/738 |
| 6,070,130 A | * 5/2000 | Gutmann et al. | ............. 702/81 |
| 6,078,189 A | * 6/2000 | Noel | .......................... 324/765 |
| 6,154,714 A | * 11/2000 | Lepejian | ..................... 700/121 |
| 6,184,048 B1 | * 2/2001 | Ramon | ....................... 324/522 |

* cited by examiner

*Primary Examiner*—John Barlow
*Assistant Examiner*—Anthony T Dougherty
(74) *Attorney, Agent, or Firm*—McGinn & Gibb, PLLC; Robert A. Walsh, Esq.

(57) ABSTRACT

A method and system are provided that minimize wafer or package level test time without adversely impacting yields in downstream manufacturing processes or degrading outgoing quality levels. The method provides optimization by determining, a priority, the most effective set of tests for a given lot or wafer. The invention implements a method using a processor-based system involving the integration of multiple sources of data that include: historical and realtime, product specific and lot specific, from wafer fabrication data (i.e., process measurements, defect inspections, and parametric testing), product qualification test results, physical failure analysis results and manufacturing functional test results. These various forms of data are used to determine an optimal set of tests to run using a test application sequence, on a given product to optimize test time with minimum risk to yield or product quality.

16 Claims, 3 Drawing Sheets

METHOD FOR TEST OPTIMIZATION USING HISTORICAL AND ACTUAL FABRICATION TEST DATA

BACKGROUND OF THE INVENTION

1. Field of the Invention

The present invention generally relates to a system and method for adaptive optimization of a testing procedure for integrated circuits being made with given quality control level(s).

2. Description of the Related Art

As the complexity of the semiconductor devices increases, conventional testing methods of integrated circuit (IC) wafers during production involve comprehensive testing methods that greatly require longer time periods to yield useful updated results for production controls resulting in greater cost per yield. Empirical data consistently shows that a relatively small number of tests typically detect all the failures on any given lot of wafer production, but that these tests are not necessarily consistent from lot to lot, or sometimes even wafer to wafer. Furthermore, current methods include manual pattern ordering that does not provide real-time testing based on a set of comprehensive inputs that include current yield results; historical results (at both circuit and product level); and previous test results (wafer in-line test). Manual pattern ordering can take days to weeks depending on an engineer's time and the amount of data to be analyzed.

Thus, there is a need for minimizing testing time requirements during product (wafer) fabrication yet maintaining acceptable quality control levels, resulting in lower production cost. Moreover, there is a need for a system that can adaptively modify automated production testing equipment using methods that include determining levels of quality control during processing.

SUMMARY OF THE INVENTION

In view of the foregoing and other problems, disadvantages, and drawbacks of prior comprehensive testing methods that do not necessarily optimize test procedures for fabricating a product, the present invention has been devised, and it is an object of the present invention to provide a system and method for adaptive optimization of test procedures for a product, which is particularly applicable to production of integrated circuit wafers, given requisite quality control levels. To attain these objects, there is provided, according to one aspect of the invention, a method that minimizes product (wafer or package level) test time without adversely impacting yields in downstream manufacturing processes or degrading outgoing quality levels. The optimization problem here is provided by determining, a priori, the most effective set of tests for a given product (in particular, lot or wafer). In the case of low yielding products, optimizing the sequence of tests for efficient detection of failures also has significant cost benefit to manufacturing tests. The invention includes use of adaptive control applications (e.g., artificial intelligence or expert systems) in a processor-based system that integrates multiple sources of data that include: historical and realtime data of: product specific and lot specific, from product (wafer) fabrication data (i.e., process measurements, defect inspections, and parametric testing), product qualification test results, physical failure analysis results and manufacturing functional test results. These various forms of data are used to determine the best set of tests to run, and the best sequence in which to run them, on a given product, to optimize test time with minimum risk to yield or outgoing quality.

The advantages of this method over other previously used quality control test methods during product production include: using more comprehensive sets of data as inputs to the decision making process of an adaptive controlled testing program for quality control; using fabrication data and correlations between specific fabrication parameters/measurements and test failures; using historical product data combined with lot specific data. The method of the invention integrates both historical and real time data to optimize product testing "on-the-fly" for effective production controls; and using specialized adaptive control software, to automate data analysis, decision making and test program generation processes.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

The present invention is primarily disclosed as a method, it will be understood by a person of ordinary skill in the art that an apparatus, such as a conventional data processor, including a CPU, memory, I/O, program storage, a connecting bus, and other appropriate components, could be programmed or otherwise designed to facilitate the practice of the method of the invention. Such a processor would include appropriate program means for executing the method of the invention. Also, an article of manufacture, such as a pre-recorded disk or other similar computer program product, for use with a data processing system, could include a storage medium and program means recorded thereon for directing the data processing system to facilitate the practice of the method of the invention. It will be understood that such apparatus and articles of manufacture also fall within the spirit and scope of the invention.

Figure 1:
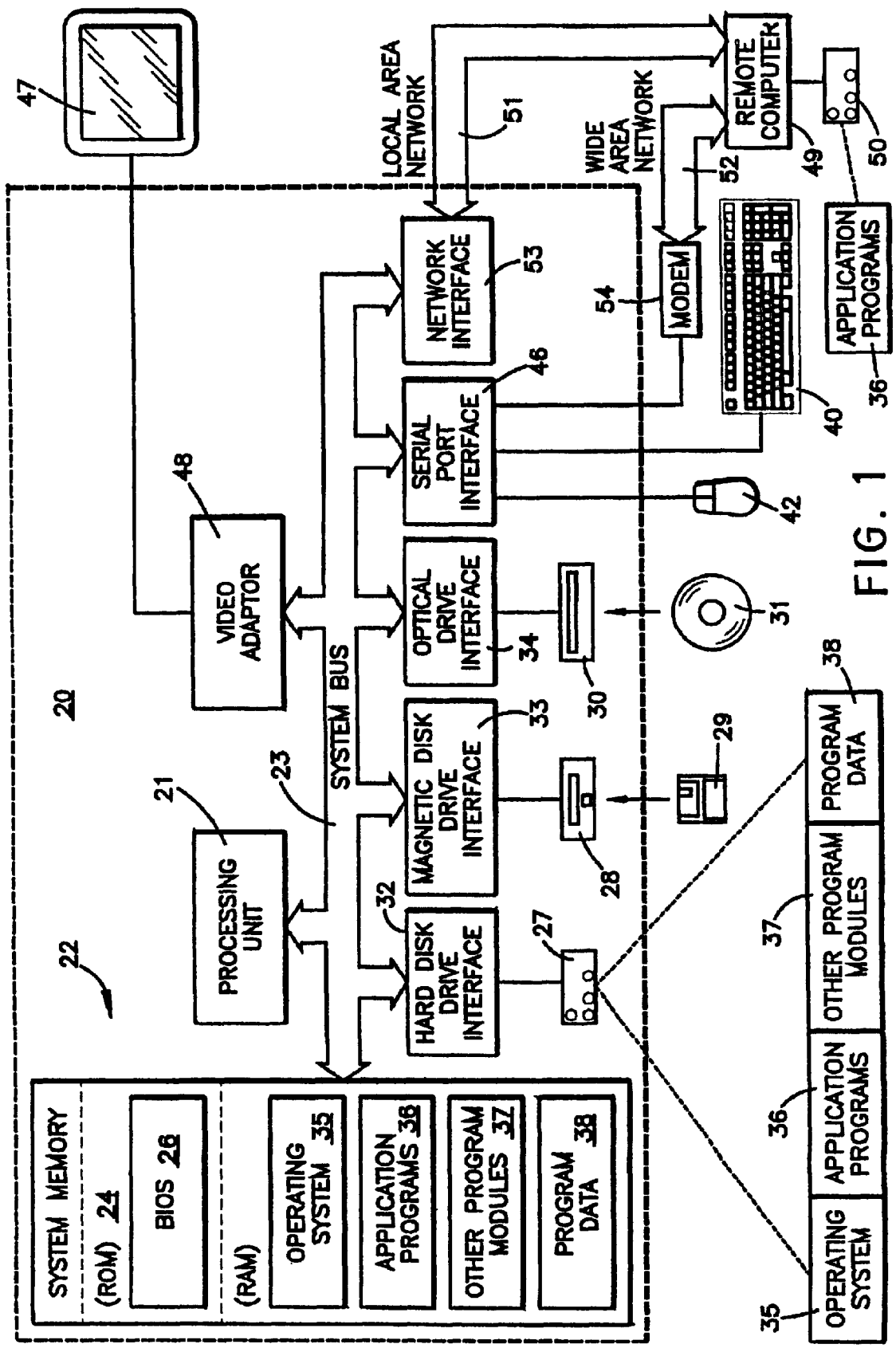
FIG. 1 is a block diagram of a system for implementing the method of the invention.

FIG. 1 shows an exemplary data processing system for practicing the method of the invention that includes a computing device in the form of a conventional computer 20, including one or more processing units 21, a system memory 22, and a system bus 23 that couples various system components including the system memory to the processing unit 21. The system bus 23 may be any of several types of bus structures including a memory bus or memory controller, a peripheral bus, and a local bus using any of a variety of bus architectures. The system memory includes read only memory (ROM) 24 and random access memory (RAM) 25. A basic input/output system 26 (BIOS), containing the basic routines that helps to transfer information between elements within the computer 20, such as during start-up, is stored in ROM 24.

The computer 20 further includes a hard disk drive 27 for reading from and writing to a hard disk, not shown, a magnetic disk drive 28 for reading from or writing to a removable magnetic disk 29, and an optical disk drive 30 for reading from or writing to a removable optical disk 31 such as a CD-ROM or other optical media. The hard disk drive 27, magnetic disk drive 28, and optical disk drive 30 are connected to the system bus 23 by a hard disk drive interface 32, a magnetic disk drive interface 33, and an optical drive interface 34, respectively. The drives and their associated computer-readable media provide nonvolatile storage of computer readable instructions, data structures, program modules and other data for the computer 20. Although the exemplary environment described herein employs a hard disk, a removable magnetic disk 29 and a removable optical disk 31, it should be appreciated by those skilled in the art that other types of computer readable media which can store data that is accessible by a computer, such as magnetic cassettes, flash memory cards, digital video disks, Bernoulli cartridges, random access memories (RAMs), read only memories (ROM), and the like, may also be used in the exemplary operating environment. Information stored in the storage area in a well-known manner that is readable by a machine, and that tangibly embodies a program of instructions executable by the machine for performing the method of the present invention described herein.

A number of program modules may be stored on the hard disk, magnetic disk 29, optical disk 31, ROM 24 or RAM 25, including an operating system 35, one or more application programs 36, other program modules 37, and program data 38. A user may enter commands and information into the computer 20 through input devices such as a keyboard 40 and pointing device 42. Other input devices (not shown) may include a microphone, joystick, game pad, satellite dish, scanner, or the like. These and other input devices are often connected to the processing unit 21 through a serial port interface 46 that is coupled to the system bus, but may be connected by other interfaces, such as a parallel port, game port or a universal serial bus (USB). A monitor 47 or other type of display device is also connected to the system bus 23 via an interface, such as a video adapter 48. In addition to the monitor, personal computers typically include other peripheral output devices (not shown), such as speakers and printers. The computer 20 may operate in a networked environment using logical connections to one or more remote computers, such as a remote computer 49. The remote computer 49 may be another personal computer, a server, a router, a network PC, a peer device or other common network node, and typically includes many or all of the elements described above relative to the computer 20, although only a memory storage device 50 has been illustrated in FIG. 1. The logical connections depicted in FIG. 1 include a local area network (LAN) 51 and a wide area network (WAN) 52. Such networking environments are commonplace in production facilities, enterprise-wide computer networks, intranets and the Internet.

Figure 2:
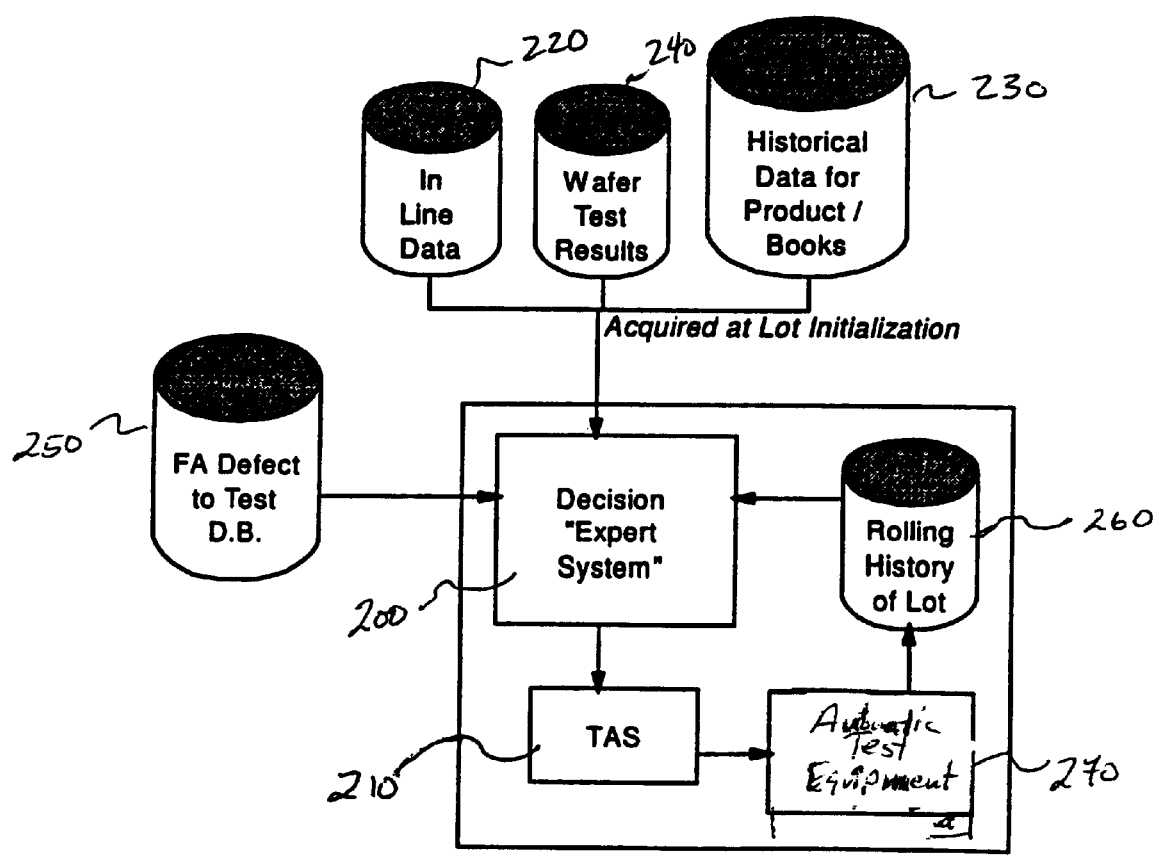
FIG. 2 is a generalized form of the method of the invention.

When used in a LAN networking environment, the computer 20 is connected to the local network 51 through a network interface or adapter 53. When used in a WAN networking environment, the computer 20 typically includes a modem 54 or other means for establishing communications over the wide area network 52, such as the Internet. Actual input-output links with the system 20 provide the necessary command and control of automatic test equipment (ATE) 270 forming part of the plant for product fabrication as shown in FIG. 2. The modem 54, which may be internal or external, is connected to the system bus 23 via the serial port interface 46. In a networked environment, program modules depicted relative to the computer 20, or portions thereof, may be stored in the remote memory storage device. It will be appreciated that the network connections shown are exemplary and other means of establishing a communications link between the computers may be used.

Figure 3:
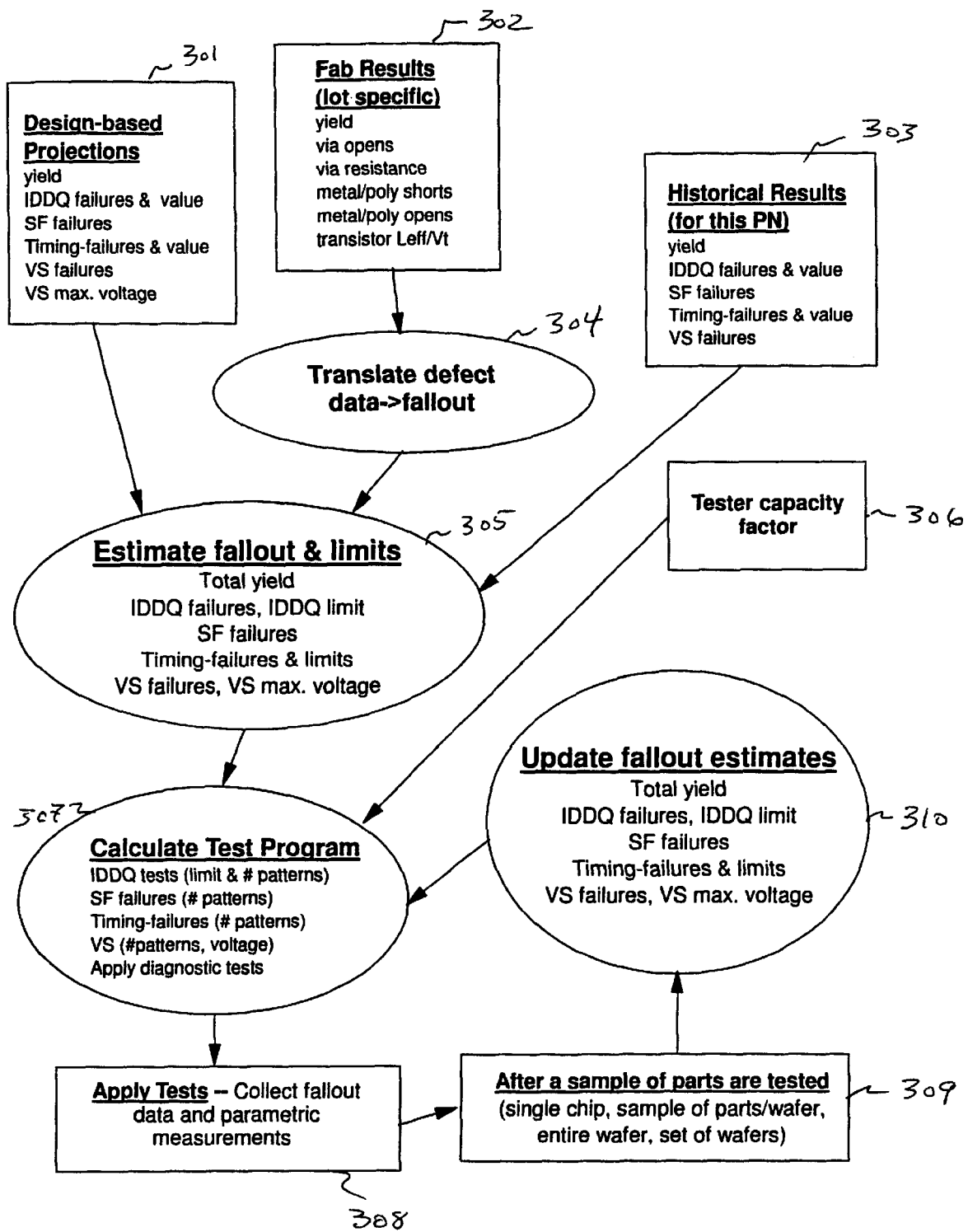
FIG. 3 shows data flow in a preferred method of implementing the invention.

The method of the invention is shown in a generalized form in FIG. 2 and in a preferred exemplary form in FIG. 3. The method can be implemented in any combination using standard programming and/or engineering techniques using computer programming software, firmware, hardware or any combination or subcombination thereof. Any such resulting program(s), having computer readable program code means, may be embodied or provided within one or more computers readable or usable media such as fixed (hard) drives, disk, diskettes, optical disks, magnetic tape, semiconductor memories such as read-only memory (ROM), etc., or any transmitting/receiving medium such as the Internet or other communication network or link, thereby making a computer program product, i.e., an article of manufacture, according to the invention. The article of manufacture containing the computer programming code may be made and/or used by executing the code directly from one medium, by copying the code from one medium to another medium, or by transmitting the code over a network.

The computing system 20 for implementing the method of the invention can be in any combination or subcombination of software, firmware, hardware, which embody the invention and cooperatively function with a process tool controller ATE 270 that provides quality control data of a lot of products (wafers) being processed. One skilled in the art of computer science will easily be able to combine the software created as described with appropriate general purpose or special purpose computer hardware to create a computer system and/or computer subcomponents embodying the invention and to create a computer system and/or computer subcomponents for carrying out the method of the invention with production control tool equipment.

Referring now to FIG. 2, the method of the invention involves two major processes. The first portion of processing determines the optimum set of tests and applies an initial test application sequence 210 (TAS) program controls with which to start testing. This method processes all the data available prior to the start of wafer testing on a particular wafer lot. This includes in-line data 220 specific to the process technology used to produce the particular product, historical data specific to product (wafer) fabrication 230 and test results data 240 specific to the particular lot to be tested. It also includes a generated physical failure analysis (FA) defect-to-test database 250 that is the results of FA of a lot and comprises a list of defects, their likelihoods of occurrence, and their behavior on a multiplicity of tests.

These data are analyzed by specialized software applications to determine and generate the optimum test application sequence program 210 to apply at the outset of testing using adaptive controller 200 "Expert System" software that in exemplary form can comprise any artificial intelligence (AI) applications, expert systems, neural and/or fuzzy logic techniques, which use data from the various historical databases and real-time rolling lot history data 250 to generate the test application sequence testing program 210 that is used to control the automatic testing equipment ATE 270 with a requisite quality control factored in. The automated test equipment (ATE) 270 can be an electronic testing device that applies stimulus test signals to a chip and reads a resulting output therefrom. Typically, the ATE can also compare the test output to an expected result. When the ATE is applied to a built-in-self-test (BIST) of the product, the stimulus test signal applied is control input signals to set up and initiate the BIST.

These data base subsystems to be described are information processors that may consist either of dedicated hardware modules, separate program modules running on a single computer, or any combination thereof within the overall system 20. Thus the input databases represent not only the historical prior data of a fabrication process, but also any associated updated real time rolling lot specific data 260 from the tool controlled ATE 270. This historical data includes fabrication in-line defect inspection data and in-line parametric (kerf) test data 230; wafer final test results data 220; historical package final test data and electronic chip ID (ECID) database 230; qualification test/stress results data showing correlations between specific fabrication parameters and test failure modes; historical manufacturing data showing correlations between specific fabrication parameters and test failure modes; physical failure analysis data showing correlations between specific fabrication parameters and test failure modes; customer returns data showing correlations between specific fabrication parameters and test failure modes; customer quality requirements and expectations. Electrical characteristics of sites adjacent on a wafer used in association with the real time rolling history of a lot database include real time rolling averages of defects in that lot and weighting recent data higher. The optimum testing sequence is one that has the lowest test cost for a given outgoing quality level. Value of test results to creation of the knowledge databases on which test and manufacturing process decisions can be made can also be included. Test cost can be defined broadly to include factors such as available test floor capacity.

In preferred form, the adaptive method controller 200 (a data interpreter) outputs a test application sequence program 210 that is a rule-based AI programming sometimes referred to as a production system or an expert system, that uses a knowledge database consisting of a set of rules or productions which allow the production of new information on the basis of currently known facts obtained from the rolling history database 260 and the historical database containing facts at the outset. The controller 200 can include an inference engine, for determining the applicability of the rules in the context of the rolling history database 260, the selection of appropriate rules, and operating on the rolling history database 260 by use of the selected rules.

The currently known facts comprise both historical and real-time production test data that is gathered and analyzed, where the decision controller 200 makes further modifications to the test application sequence program 210. This is accomplished by testing a relatively small, random sample of die or packages to a comprehensive set of tests and analyzing the test results data with a specialized set of software applications to determine if there are failures detected by tests not included in the set of tests defined by the first process or whether certain tests have a higher incidence of failure. The adaptive control applications for generating the test application sequence controller 210 would then determine whether the set or sequence of tests should be modified from those determined by the first process. From this point, the manufacturing testing programs would be modified. The advantage of this method lies in the automation of the data analysis to optimize testing based on both comprehensive historical data and realtime test results data in a manufacturing environment.

The knowledge database of the adaptive control method contains the logic used by the system in evaluating the significance of the data. Each rule of the knowledge database is typically in the form of an implication or "IF-THEN" statement. Each such rule thus has a premise and a conclusion where the premise may consist of any number of clauses representing factual statements or conclusions which are combined disjunctively or conjunctively. When the premise is satisfied, the rule is "fired," and the rule's conclusion is taken by the system to be true. That conclusion may then be used by the system in activating other rules and so on. The rules thus represent the relationships between testing parameters, such as prior historical test results, and generation requisite rules of the TAS controller 210. Using what is referred to as forward-chaining, database facts, and/or conclusions from applicable rules are linked to the premises of other rules until one or more ultimate test program conclusions are reached. In the event that no such ultimate conclusions can be verified, the system outputs the premises needed for such a conclusion in the form of a recommendation for further tests or data.

An exemplary form of the method is shown in FIG. 3 that illustrates an adaptive method of the invention for generating the TAS controller 210 for an optimized testing program for an integrated circuit wafer process based on many input factors, limited as a set of input parameters and test program options for illustrative purposes. Each of the steps in the diagram are as follows:

The design-based projections 301 includes data that estimates the following factors based on design-specific information that include: yield, quiescent power supply current (IDDQ) failures, IDDQ measurements, stuck-fault (SF) test pattern failures, timing-related failures, voltage stress (VS) failures, and the maximum VS power supply voltage.

Given design information like technology ground rules, number of circuits and wiring density, it is common in the industry to estimate an expected yield (e.g., 60%). As an example, assume that the tests in the test program are "IDDQ," "stuck-fault (SF) test patterns," "timing/delay tests," and "voltage screen (VS)" and these tests are applied in this order (in an actual test program the number of tests may be significantly larger). Based on general technology data or on design-specific information, it is possible to estimate the "fallout" for each test. "Fallout" is the percentage of devices that would fail each of these tests (assuming that the test program stops on the first failure). For this example, by assuming that the percent projected to fail each test are: IDDQ failures (26%); SF fails (8%); Timing fails (1%); and VS fails (5%). Note that yield added to the failure percentages must equal 100%, a determination is made as to expected IDDQ leakage value (range of 10 uA-100 uA), timings (range of 100 MHz to 150 MHz), and maximum VS VDD voltage that should be applied (e.g., 4.0 volts) to the lot of wafers.

The fabrication results 302 include a number of parametric and defect-related measurements that have previously been made. Historically this data is not taken into account when determining how to test ICs. In the invention, the optimized testing procedure occurs when this information is taken into account. Frequently, these in-line measurements to be used to calculate an expected wafer lot yield. Defect-related typical in-line measurements may include: % via opens; % Metal/poly shorts; and % metal/poly opens.

For each of these defect-related measurements, by assuming normalized measurements to a scale of '1' through '10' where a '5' is normal (e.g., a '1' for metal/poly shorts means that this defect type is very unlikely has been provided, where a '10' means a relatively high occurrence is expected of metal/poly shorts). Note there are many ways to represent these measurements and an arbitrary choice of a '1' to '10' scale is made. Using the method of the invention, different representations can be used. The invention also have measurements that are related to defect-free structure where parametric characteristics are measured (e.g., via resistance and transistor Leff/Vt). For these measurements, also assume a "relative measured value" between '1' and '10' has been made (e.g., a '1' means that the via resistance measurements are relatively low). The generated TAS 210 enables translation of this defect information into expected fallout as defined below.

Historical results for this part number PN data 303, unless this is the initial test run of the production, there is historical fallout data. Averages of all previous lots may be used or more recent lots may be weighted higher. Also parametric measurement data such as IDDQ values are available and are used.

Translate defect data into fallout data 304 provides capability to translate defect-related fabrication measurements historical data 302 into expected fallout for the given set of tests. There are a number of different ways that this translation could be implemented including neural networks, decision trees or a rule-driven lookup table. As an example without undue complexity, the following provides some readily known defect types that cause specific tests to be more likely to fail. In the example, the following assumptions are made as to the following defect-failing test relationships: high resistance vias or open vias cause AC or timing-related failures; Metal/poly shorts cause IDDQ and stuck-fault test failures and voltage stress failures; and Metal/poly opens may pass IDDQ tests, but would fail stuck-fault tests. These relationships are not exact, but correlations between defect types and test failures are well accepted in the industry.

Given a project yield from the fabrication data, an expected fallout percentage test is expected. In addition to projected fallout, in-line measurements are translated into a value that would be used by the test program at this step. For the example, "Leff/Vt measurements" directly correlate to product speed. During this step of the method, an "expected product speed" is derived (eg., a scale from '1' to '10' where '1' is fastest and '10' is slowest is used). Also, the same "Leff/Vt measurement" must be used to project the expected IDDQ value, wherein the same scale (i.e., '1' is highest IDDQ value, '10' is the low IDDQ) is used).

Estimated fallout & limits determinations 305 take the projected fallouts and limits (from fabrication, design, historical results) to come up with a single projection from this multitude of information. These three inputs are weighted appropriately. For this example shown in FIG. 3, assume that the average of all three is taken. For the yield and fallout data, the project value is the average of the three fabrications, design, and historical values. For this example, assume that the following are the average projections: Yield: 55%; IDDQ fallout: 35%; SF fallout: 8%; Timing fallout: 0.5%; and VS fallout: 1.5%. For projecting timing and IDDQ limits, the method is slightly different. For these values, the design projections provide the product range. Then the fabrication results and the historical data can be used to determine where within the range the product to be tested may fail. For example, assume IDDQ values are for design information: IDDQ range: 10 uA to 100 uA (normal is 20 uA); Fabrication data: Leff is slightly short—therefore a higher IDDQ is expected ("3" on 1–10 scale); Historical data: typical value is 20 uA. From this information, the design information & historical data are the same, but the fabrication data suggests that IDDQ may be slightly high. Using the analytical 1–10 scale previously defined and a standard IDDQ distribution, the expected IDDQ for this lot is 40 uA for example. Next, assume that timing values are design information (e.g., maximum functional speed (FMAX) range: 100 MHz to 200 MHz (150 MHz is normal); fabrication data: Leff is slightly short, therefore a faster FMAX is expected ("3" on 1–10 scale); and historical data: typical value is 140 MHz). From this information, the design information & historical data are 150 MHz & 140 MHz, respectively. By taking the average of the design & historical data and using the "3" for fabrication data and a standard delay vs. Leff distribution, the expected FMAX for this wafer lot is 166 MHz.

Tester capacity factor input data 306 optionally includes available tester capacity as a factor when determining the TAS 210 generation program. This additional step is factored in and implemented if extra capacity is available whereby additional testing can be performed at no extra cost (e.g., assume that the "tester capacity factor" is one of three values: factory floor is very busy (no excess capacity); normal (near or slightly above capacity); and excess tester capacity is available). Additionally, turnaround time commitments can also be included.

Calculate test program 307 generating TAS 210 and outputting the test application sequence enables the number of tests to be applied to the product and the test limits to be automatically programmed. As an example of an exemplary TAS 210 with the following testing requirements and parameters can be used that include: 1) IDDQ tests (1 to 10 test patterns, programmable pass/fail limit) having a Default: 5 IDDQ test patterns, 50 uA limit; and a Base fallout: 70%; 2) Stuck-fault tests (up to 5000 test patterns can be applied) having a Default: 3000 test patterns; and Base fallout: 24%; 3) Timing-related tests (up to 10,000 test patterns can be applied, FMAX programmable) having a Default: 7000 test patterns, 180 MHz; and a Base fallout: 1.5%; 4) Voltage stress tests (1 to 10 "bumps", programmable maximum VDD) having a Default: 5 bumps, VDD=4.2V; and Base fallout: 4.5%; 5) FMAX measurements (same measurement applied for each device); and 6) Suite of diagnostic tests (only applied if there is a problem that needs to be diagnosed) having a Default that is not to apply these tests.

Default values are included and used in the absence of projected information. "Base fallout" numbers represent the percentage of failures that are expected to fall into this category (before design, fabrication, or historical data is included). For example, 80% of the failures are expected to fail the IDDQ test as defined. Note that changes to the test program order can be made, but this is not shown in this example. Given the "Estimated Fallout" from the earlier step, each of the test program values can be established.

Yield: 55%
IDDQ fallout: 35% (base: 31.5)==>7 test patterns
SF fallout: 8% (base: 10.8)==>2500 test patterns
Timing fallout: 0.5% (base: 0.67)==>5200 test patterns
VS fallout: 1.5% (base: 2.0)==>4 bumps The "base fallout" values are normalized to the project yield. For example, the projected IDDQ fallout for the ICs to be tested is higher than the "base amount." Thus, the amount of IDDQ testing is increased from 5 to 7 test patterns. However the projected SF fallout is lower than the base amount so the amount of stuck-fault testing is reduced from 3000 to 2500 test patterns. The projected IDDQ and FMAX values are 40 uA and 166 MHz. From these expected values, a manufacturing (mfg) limit can be set. For example, the maximum IDDQ for a given lot may be 10×the expected value, whereby the mfg limit is set to 400 uA. The FMAX limit may be set by the application or speed bins (e.g., using this example, assume the minimum acceptable FMAX is 100 MHz). The voltage stress VDD voltage is set at the design projected value of 4.0 V. The diagnostic test flag would normally be set to "NO" unless fabrication in-line results suggest a major defect-related problem that should be evaluated at wafer test. Testing 308 using the tool control metrology equipment as part of the plant with sampling 309 of lots or individual components (chips) occurs during production of the product in which testing would start using the previously defined values. These values can be used to test the entire lot, or stopped after a sample and the TAS 210 being updated using test data from the lot under production. The sample size before adjusting limits could be every chip, predefined sample of chips/wafer; or each wafer.

Update fallout estimates 310 occurs after a sample of devices are tested. The TAS 210 program parameters are preferably then updated. These new TAS program parameters would normally be calculated by weighting "projected" fallout estimates and actual measurements from the tested sample (e.g., using this example, assume that the test program is updated based only on hardware measurements from a sample of ICs).

Yield: 55%

IDDQ fallout: 25% (base: 31.5)==>4 test patterns

SF fallout: 17% (base: 10.8)==>4500 test patterns

Timing fallout: 1.0% (base: 0.67)==>6000 test patterns

VS fallout: 2.0% (base: 2.0)==>5 bumps

Again, the "base fallout" values must be normalized to the projected yield. From these values, the number of IDDQ patterns is reduced from 7 to 4. The number of stuck-fault patterns is increased from 2500 to 4500 test patterns. The IDDQ measured values are 60 uA. Assuming the same maximum of 10×the typical value, the IDDQ maximum limit would be increased to 600 uA. If a particularly interesting failure mode (e.g., timing-related failures) occurs at a higher than expected rate, then the diagnostic test mode can be set to "YES" and additional diagnostic testing applied.

Examples of applicable use of the invention include: 1) In-line data shows possible metal shorts. To see if a gross failure has occurred, the TAS 210 is changed to put the IDDQ test first in the sequence to detect any power to ground shorts as soon as possible; 2) In-line data shows very short channels. It is known that short channels fail high voltage test patterns are more likely to fail the nominal or low voltage test. Thus, the TAS 210 is modified to put the test pattern tests at elevated voltage to be run before both nominal and low voltage tests; 3) a microprocessor has been tested stand alone for a period of years. During this time timing failures have been a main detractor of yield for the microprocessor. The test decision controller 200 recognizes this product related trait from historical data 230. When the microprocessor is embedded as a core of an application specific integrated circuit forming part of an unrelated product, the TAS 210 is modified to run timing-related tests early in the test sequence to minimize the number of test; 4) during test of a wafer, large fallout is occurring at low voltage logic built-in self-test (LBIST) testing. As the number of LBIST failures increase, the TAS 210 is modified to put the LBIST testing towards the beginning of the test sequence; 5) a generic phase-lock-loop (PLL) design can only run a certain tester speed when channel lengths are of a given dimension. In-line wafer data of voltage threshold and Leff parameters shows that the current wafers may not have sufficient guard band to run at the typical PLL speed. A historical fault dictionary database 230 knows to run the PLL test early in the test sequence to verify functionality; and 6) Historical database 230 shows that no modules have ever failed a given test pattern. This test pattern migrates to the end of the TAS 210 (this test pattern can eventually be removed from the TAS).

Although the invention is particularly suitable for IC chip fabrication, it can also be applied to any fabrication process of a product with similar quality control data requirements are used in the manufacturing process. The method of the invention provides an adaptive testing application sequence (TAS) that is modifiable during testing that allows for diagnostic testing. Benefits provided by this invention include: shorter test times since tests which do not fail are moved to the end of the TAS sequence, and eventually removed; immediate, dynamic feedback and adjustment of the TAS; improved quality & reliability since additional testing can be added for product devices which are suspected to be of lower quality (also, if tester capacity is available, testing is increased, thereby improving product quality and reliability); and improved turn-around time for problem resolution (normally retesting is required if fault diagnostics (fault localization) is required).

While the invention has been described in terms of preferred embodiments, those skilled in the art will recognize that the invention can be practiced with modification within the spirit and scope of the appended claims.

What is claimed is:

1. A method for testing products being produced, said method comprising:

testing said product during production using a test application sequence, said testing producing defect signature data;

changing numerical limits tests within said test application sequence; and recomputing said test application sequence based on said defect signature data;

wherein said recomputing compromises one of adding tests to said test application sequence and removing tests from said tests application sequence.

2. A method for testing products being produced, said method comprises:

testing said product during production using a test application sequence, said testing producing defect signature data, changing a number of times each test is performed within said test application sequence and removing tests from said test application sequence; and recomputing said test application sequence based on said defect signature data, wherein said recomputing comprises one of adding tests to said test application sequence and removing tests from said test application sequence.

3. A method for testing products being produced, said method comprising:

testing said product during production using a test application sequence to match the amount of tester capacity available;

recomputing said test application sequence based on said defect signature data, wherein said recomputing comprises one of adding tests to said test application sequence and removing tests from said test application sequence.

4. A method for testing products being produced said method comprising:

testing said products during production using a test application sequence, said testing producing defect signature data; and changing test patterns in teat application sequence;

wherein said recomputing comprises one of adding tests to said test application sequence and removing tests from said test application sequence.

5. A method for testing products being produced, said method comprising:

creating a test application sequence based on historical production data;

testing said product during production using said test application sequence, said testing producing defect signature data;

changing numerical limits a tests within said test application sequence; and recomputing said test application sequence based on said defect signature data, wherein said recomputing comprises one of adding tests to said test application sequence and removing tests from said test application sequence.

6. A method for testing products being produced, said method comprising:

creating a test application sequence based on historical production data;

testing said product during production using said test application sequence, said testing producing defect signature data;

changing a number of time each test is performed within said test application sequence; and recomputing said test application sequence based on said defect signature data, wherein said recomputing comprises one of adding tests to said test application sequence and removing tests from said tests application sequence.

7. A method for testing products being produced, said method comprising:

creating a test application sequence based on historical production data;

testing said product during production using said test application sequence, said testing producing defect signature data;

limiting the amount of test performed in said test application sequence to match the amount of tester capacity available; and recomputing said test application sequence based on said defect signature data, wherein said recomputing comprises one of adding tests to said test application sequence and removing tests from said test application sequence.

8. A method for testing products being produced, said method comprising:

creating a test application sequence based on historical production data;

testing said product during production using said test application sequence, said testing producing defect signature data; and recomputing said application on sequence based on said defect signature data, and changing test patterns in said test applicant sequence;

wherein said recomputing comprises one of adding tests to said test application sequence.

9. A method for testing products being produced, said method comprising:

testing said product during production using a test application sequence, said testing producing defect signature data;

changing numerical limits tests within said test application sequence;

recomputing said test application sequence based on said defect signature data, wherein said recomputing comprises one of adding tests to said test application sequence and removing tests from said test application sequence, and wherein said recomputing is preformed real time such that said test application sequence is dynamically limited to tests that are more likely to fail than tests not included in said test application sequence even as the types of detects change during production of said product.

10. A method for testing products being produced, said method comprising:

testing said product during production using said test application sequence, said testing producing defect signature data;

changing a number of times each test is performed within said test application sequence;

recomputing said test application sequence based on said defect signature data, wherein said recomputing comprises one of adding tests to said test application sequence and removing tests from said test application sequence, and wherein said recomputing is performed in real time such that said test application sequence is dynamically limited to teats that re more likely to fill than tests not included in said test application even as the a of defects change during production of said product.

11. A method for testing products being produced, said method comprising:

testing said product during production using said test application sequence, said testing producing defect signature data;

limiting the amount of testing performed in said test application sequence to match the amount of tester capacity available;

recomputing said test application sequenced based on said defect signature data, wherein said recomputing comprises one of adding tests to said test application sequence and removing tests from said test application sequence, and wherein said recomputing is performed in real time such that said test application sequence is dynamically limited to tests that are more likely to fail than tests not included in said test application sequence even as the types of defects change during production of said product.

12. A method for testing products being produced, said method comprising:

testing said product during production using said test application sequence, said testing producing defect signature data; and recomputing said test application sequence based on said defect signature data, and changing test patterns in said test application sequence;

wherein said recomputing one of adding tests to said test application sequence and removing tests from said test application sequence, and wherein said recomputing is preformed in real time such that said test application sequence is dynamically limited to tests that are more likely to fail than tests not included in said test application sequence even as the types of defects change during production of said product.

13. A program storage device readable by machine tangibly embodying a program of instructions executable by maid machine for performing a method of testing products being produced said method comprising:

testing said product during production using a test application sequence said testing producing defect signature data;

changing numerical limits on tests within said test application sequence; and recomputing said tests application sequence based on said defect signature data, wherein said recomputing comprises one of adding tests to said test application sequence and removing tests from said test application sequence.

14. A program storage device readable by machine tangibly embodying a program of instructions executable by said machine for performing a method of testing products being produced, said method comprising:

testing said during production using a test application sequence, said testing producing defect signature data;

changing a number of times each test is performed within said test application sequence; and recomputing said test application sequence based on said defect signature data, wherein said recomputing comprises one of adding tests to said test application sequence and removing tests from said tests application sequence.

15. A program storage device readable by machine tangibly embodying a program of instructions executable by said machine for performing a method of testing products being produced, said method comprising:

testing said during production using a test application sequence, said testing producing defect signature data;

limiting the amount of testing performed in said test application sequence to match the amount of tester capacity available; and recomputing said test application sequence based on said defect signature data, wherein said recomputing comprises one of adding tests to said test application sequence and removing tests from said test application sequence.

16. A program storage device readable by machine tangibly embodying a program of instructions executable by said machine for performing a method of testing products being produced, said method comprising:

testing said during production using a test application sequence, said testing producing defect signature data; and recomputing said test application sequence based on said defect signature data, and changing test patterns in said test application sequence, wherein said recomputing comprises one of adding tests to said test application sequence and removing tests from said test application sequence.

* * * * *